United States Patent [19]

Ceraso

[11] Patent Number: 5,547,535

[45] Date of Patent: Aug. 20, 1996

[54] PROCESS FOR PRODUCING PLASTIC LAMINATES FROM CONTINUOUSLY FED BANDS

[75] Inventor: Bruno Ceraso, Milan, Italy

[73] Assignee: Cedal S.R.L., Milan, Italy

[21] Appl. No.: 362,538

[22] PCT Filed: Aug. 7, 1992

[86] PCT No.: PCT/IT92/00097

§ 371 Date: Dec. 21, 1994

§ 102(e) Date: Dec. 21, 1994

[87] PCT Pub. No.: WO94/01263

PCT Pub. Date: Jan. 20, 1993

[30] Foreign Application Priority Data

Jul. 9, 1992 [IT] Italy .................................. MI92A1676

[51] Int. Cl.$^6$ ............................ B32B 31/20; B32B 31/04; B32B 15/08; H05K 3/00

[52] U.S. Cl. ............................ 156/272.2; 156/273.9; 156/324; 29/848

[58] Field of Search ................................ 156/272.2, 273.9, 156/324; 29/846, 848

[56] References Cited

FOREIGN PATENT DOCUMENTS

| | | |
|---|---|---|
| 0385769 | 9/1990 | European Pat. Off. . |
| 0471430 | 2/1992 | European Pat. Off. . |
| 3507568 | 3/1985 | Germany . |
| 1321305 | 6/1973 | United Kingdom . |
| 9322139 | 11/1993 | WIPO . |

*Primary Examiner*—Michael W. Ball
*Assistant Examiner*—Sam Chuan Yao
*Attorney, Agent, or Firm*—Michael J. Striker

[57] ABSTRACT

Process for producing plastic laminates with metal laminae especially for printed circuits, by formation of one or more packages arranged in piles, obtained from a multicomponent band continuously fed in and, simultaneously, both from bands of supporting material impregnated with plastic material and from one or two copper bands.

3 Claims, 3 Drawing Sheets

PROCESS FOR PRODUCING PLASTIC LAMINATES FROM CONTINUOUSLY FED BANDS

BACKGROUND OF THE INVENTION

The invention concerns the processes for producing plastic laminates using metal laminae.

Plastic laminates usually consist of sheets formed of a number of layers of plastic materials stably associated, generally by pressing, on supports of paper, fabrics, fibreglass or other materials.

The plastic materials used may be of phenol, melamine, epoxy, polyester, silicon, fluoride or others.

To make printed circuits a metal lamina, especially one of copper, is glued onto one or both of their sides during the pressing process.

A pile is formed of packages all Virtually the same, each one comprising a certain number of sheets impregnated with plastic materials and copper laminae placed one on each side of the package.

A metal sheet, of stainless steel or some other type, is placed between each package, and the pile so formed is put in a multiple-plate press which simultaneously provides heat and pressure.

At the end of each heat cycle, in which a temperature of 190° C. may be reached at pressures of up to 100 kg/cm² lasting over 100 minutes including a cooling stage to 70°–80° C., a compact and rigid product is obtained the single components of which are closely associated together.

Bearing in mind the many components needed, their nature and dimensions, formation of packages is a somewhat lengthy and complex process; this raises their cost considerably especially in production of laminates for printed circuits. Clearly the presses needed for this process are complex and of low output because of the many heating plates in them, because of the need to produce simultaneously both heat and pressure, with exact timing of these stages, and the need to create, by conduction, uniform temperatures in the various packages making up the pile of which, obviously, only those at each end of it are in contact with the heating plates.

The presence of many plates in the press not only complicates it structure but lengthens the time required for loading and unloading packages while preparation of short runs is made problematic because relatively more costly.

SUMMARY OF THE INVENTION

Subject of the invention is a process for production of plastic laminates, aimed at simplifying and speeding up formation of packages, to enable use to be made of more compact and simpler presses and to facilitate transmission of calories during the heating stage and of refrigerating units during cooling.

The package or packages in the pile are made from a multicomponent band fed in continuously and simultaneously with bands of supporting material impregnated with plastic material and with one, or two, external metal bands of copper or some other suitable material.

One end of the multicomponent band is laid on a flat surface of the machine and, after a metal sheet has been put on top of it, said band is folded at 180° and matched onto the second face of said sheet then, after another metal sheet has been placed on said band, a second fold at 180° is made in the direction opposite to the first fold and matched up with the second face of the second sheet, then after a third metal sheet has been placed, yet another fold is made at 180° in the direction opposite to the second fold, and so on according to the number of packages it is desired to form.

Each length of said multicomponent band lying between one sheet of metal and another therefore forms a package with all the components of said package in their usual order. At the end of the process the laminates obtained can of course be separated by cutting the multicomponent band between one package and another.

Advantageously the heat is supplied by connecting two ends of the metal bands at the beginning and end of the package or pile of packages to a suitably high-powered generator of electricity.

In this way said bands act as electric resistances. Said heating system can naturally be associated to the usual method of heating packages by means of heating plates or in some other way. In this case the packages are heated more quickly and thermal efficiency is improved.

The components in the multicomponent band, the support bands impregnated with plastic material and the metal bands, can be fed in off reels or off other continuous feed methods. This invention clearly offers many advantages. Formation of packages to produce laminates is much quicker and more accurate, it being possible to mechanize the whole operation with consequent saving of time, labour and costs.

Utilizing cold machines, presses or autoclaves is much more simple and such equipment may be of the most varied kind.

Heating is applied to each single package and a uniform temperature can be quickly obtained. Continuity among the copper laminae comprised in each package by such laminae being in band form also leads to a considerable reduction in cooling times.

Both heating and cooling are therefore more speedy as the spread of calories and of refrigeration units in each package is not hindered by the presence of fibreglass or other supporting materials impregnated with plastic material, well known to be poor conductors of heat, in the packages above and below such material, as happens with the processes now in general use.

While present methods imply adoption of large multiple-plate presses to contain running costs, with the process here described even very small machines can be used for short runs and this applies both to direct heating, package by package, and to formation of packages by a multicomponent band already prepared both with the support components and with copper laminae.

In the case of combined types of heating—the conventional kind through the plates at the ends of the pile of packages and the direct kind through copper laminae—heating times are of course still further reduced and output thereby increased.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 2:
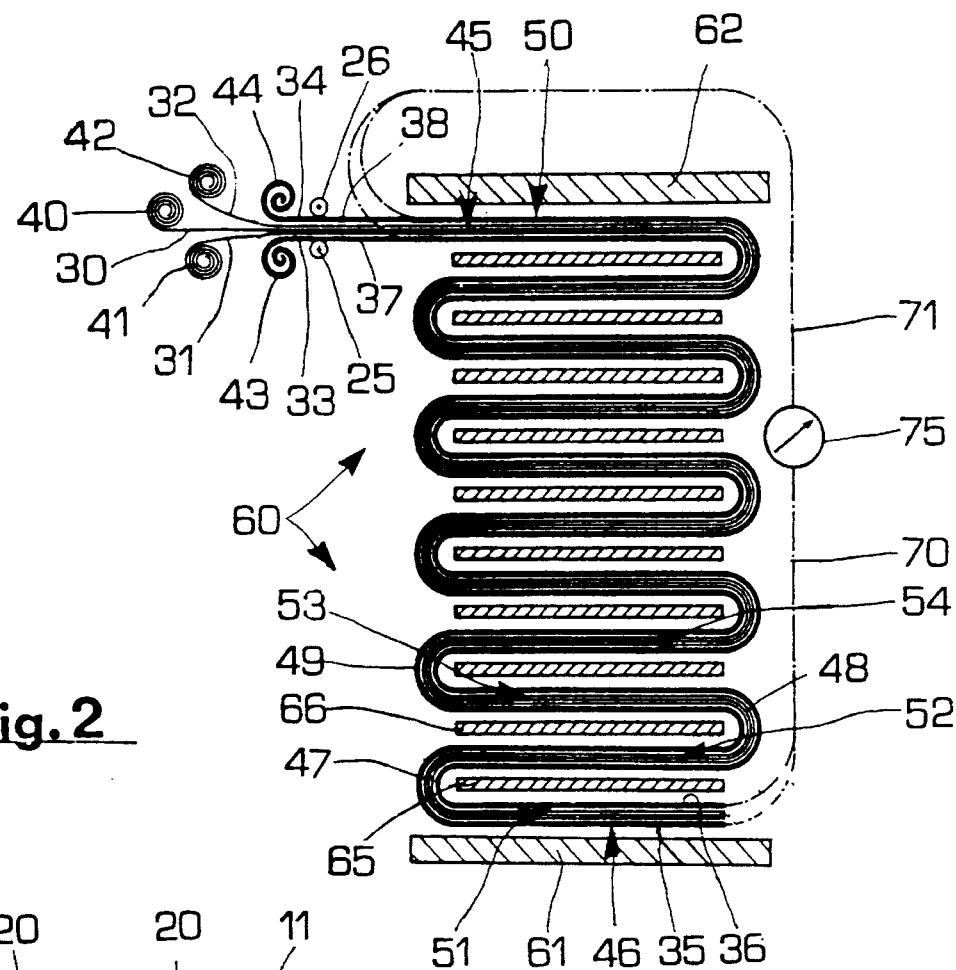
FIG. 2 Packages of laminates, made by the process subject of the invention, arranged in a press.
Figure 1:
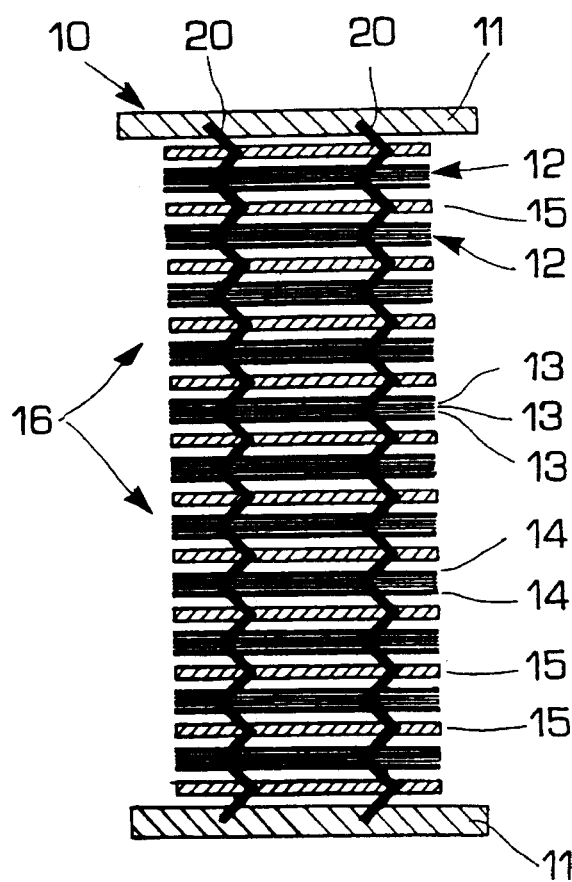
FIG. 1 Present operation of a multi-plate press for simultaneous generation of heat and, pressure with packages to make printed circuits using present processes.

The press 10 contains heating plates 11 between which the piles 16 of packages 12 are placed.

Components of said packages 12 are the sheets 13 of fibreglass fabrics impregnated with epoxy resins and the copper laminae 14 at the ends.

Steel sheets 15 are placed between one package and the next.

As shown by the zigzag line 20, the calories in the heating stage and refrigeration units in the subsequent cooling stage have to pass through the sheets 13 of fibreglass fabric which are known to be very poor heat conductors, or through other supporting materials of equal insulating properties.

Efficiency is therefore very low.

FIG. 2 gives a diagrammatic view of the process subject of the invention.

Components of the packages to make laminates are obtained from the bands 30, 31, 32 of fibreglass fabric and from copper bands 33, 34 fed in continuously off the respective reels 40, 41, 42 and 43, 44. Said bands "compacted" by the pair of rollers 25 26 form the multi-component band 45. The end 46 of said band 45 is placed on the plate 61 of the press 60 and after laying a steel sheet 65 over it, said band 45 makes a fold 47 at 180° matching up with the second face of said sheet 65.

After a second sheet 66 has been laid over it, said band makes a second fold 48 at 180° in the opposite direction to the first and then matches up with the second face of the last sheet 66.

A third fold 49 is then made at 180° in the direction opposite to the the second fold, and so on until the second end 50 reaches up against the second plate 62 of the press. In this way a series of packages like 51, 52, 53, 54 is formed joined by the various folds made at 180° like 47–49. Then the lower end pairs 35, 36 of the copper bands 33, 34 and the pairs at their upper ends 37, 38 are respectively connected to conductors 70, 71 of a generator 75 of electricity.

On closing the electric circuit all sections of said bands comprised within said ends 35, 36, 37, 38 act as electric resistances thus becoming heated themselves and heating the lengths of band 30–32 of fibreglass fabric placed between said copper bands 33, 34.

Figure 3:
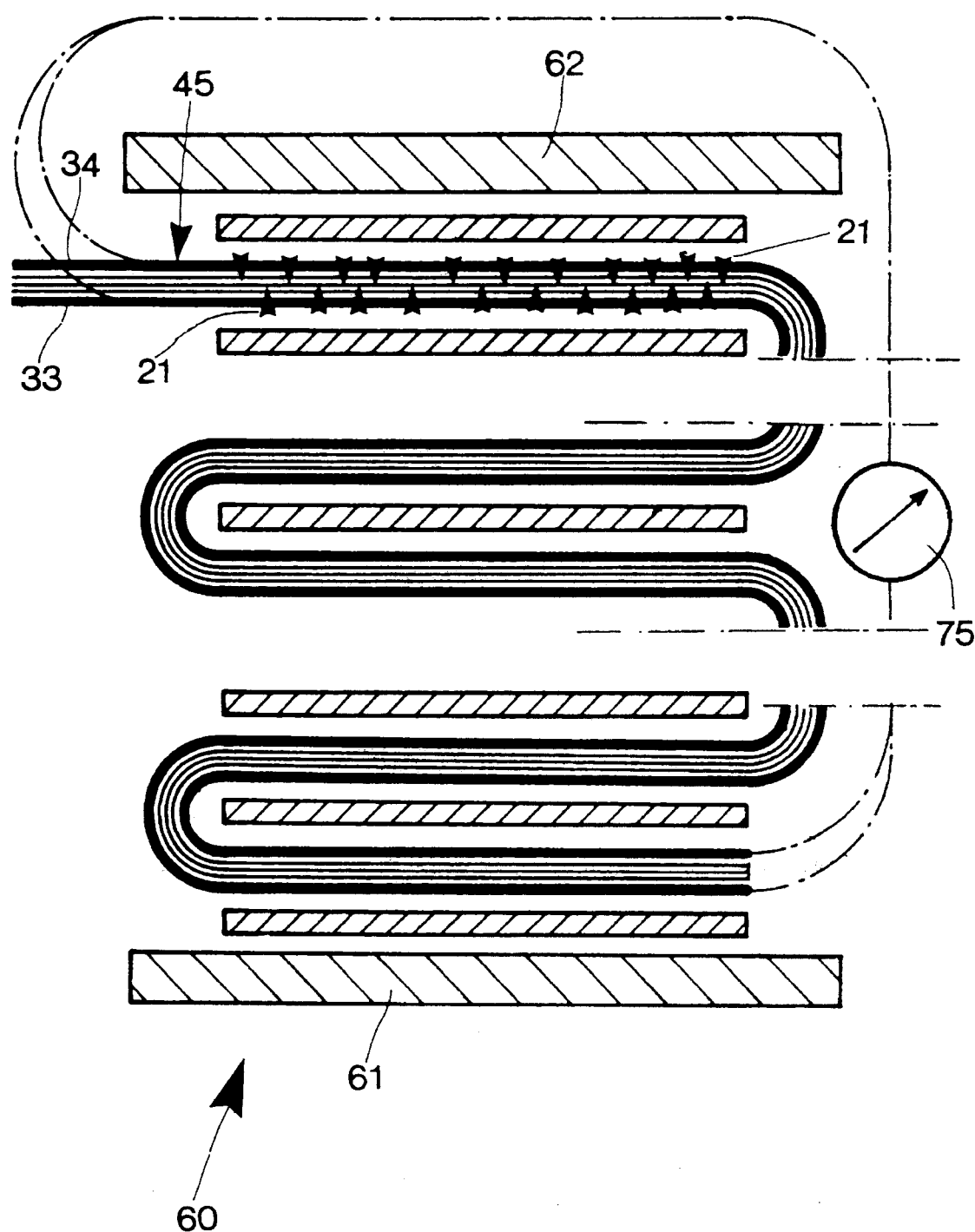
FIG. 3 Detail of the illustration in FIG. 2.
Figure 4:
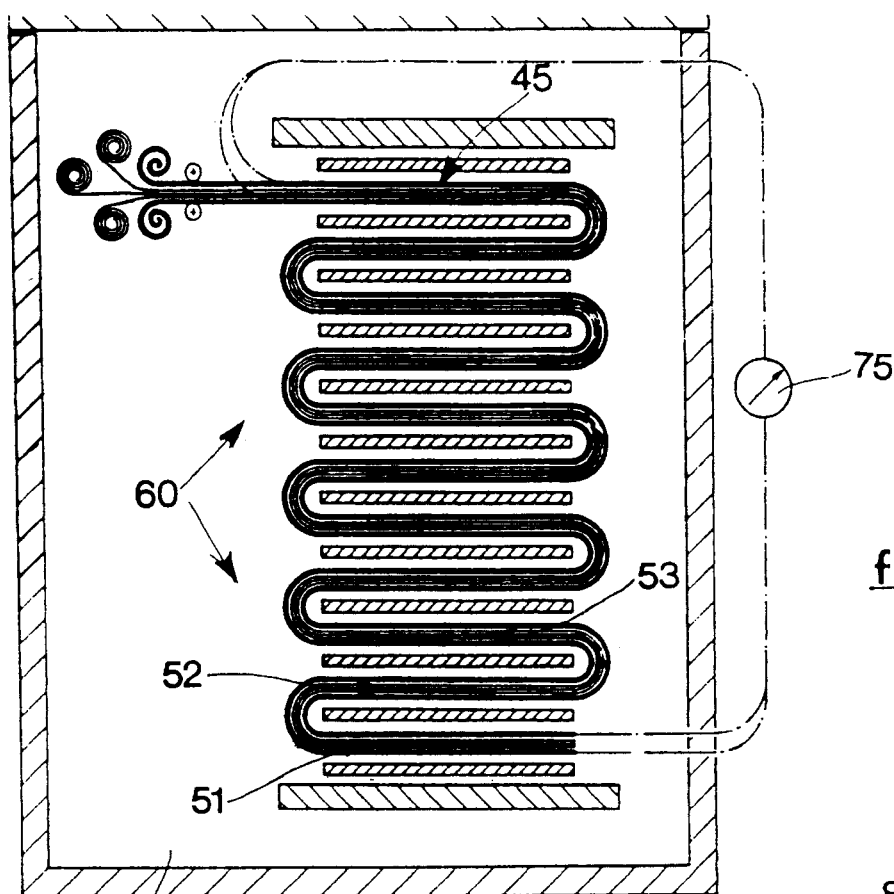
FIG. 4 Packages of laminates, made by the process subject of the invention, arranged inside an autoclave.

The effect of the heat given off by said copper bands, as indicated by the short arrows 21 in FIG. 3, and of simultaneous pressure generated by the press, brings about the pressing process and desired production of plastic laminates. The folds at points 47–49 and others between the various lengths of multicomponent band 45 folded one way and the other, like a serpentine, are then cut through for quick and easy production of laminates for printed circuits. FIG. 4 shows an autoclave 80 inside which may be seen, in diagrammatic form, a complex 60 similar to that in the press 60 already illustrated in FIG. 2.

In this figure, and in the next one 5, the various parts are marked with the same numbers as those used for similar ones in FIGS. 2 and 3.

Here too the compound band 45 is used to produce packages like 51–53.

Figure 5:
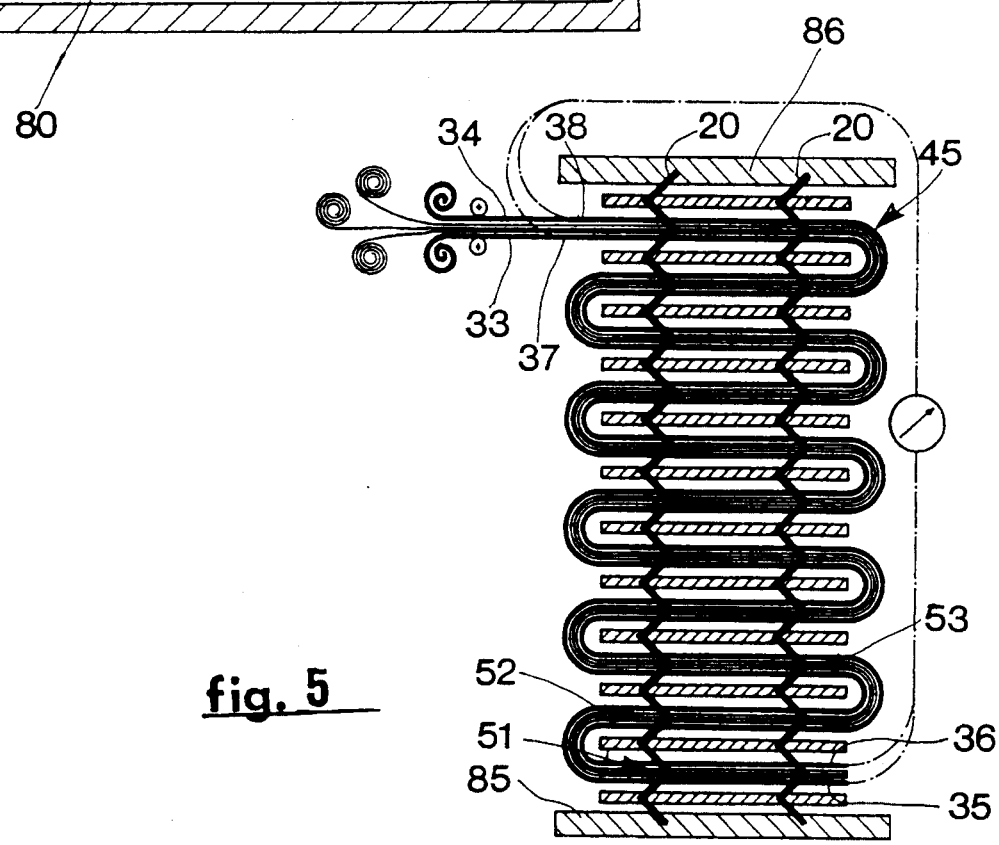
FIG. 5 How heat and cooling spread through packages of laminates made by the process subject of the invention, associated to processes in use at present.

FIG. 5 shows a process, like that described in FIGS. 2 and 3, associated to processes in use at present. The plates 85 and 86 in fact give off heat as indicated by the zigzag lines 20.

The various packages, such as 51–53, are therefore subjected to two sources of heat, one from said plates 85 and 86 and one generated by the lengths of copper band 33 34 between the ends 35–36, 37–38, combining the two effects to achieve greater efficiency.

As the above invention has been described and explained solely as an example of its use which is not limited to this, and to show its essential characteristics, numerous changes can be mar to it according to industrial, commercial and other requirements, and other systems and means can be included without thereby altering its sphere of operation.

It must therefore be understood that the application to patent comprises any equivalent use of the concepts and any equivalent product executed and/or in operation in accordance with any one or more of the characteristics indicated in the following claims.

I claim:

1. A process for producing plastic laminates for printed circuits, comprising forming at least two packages each including internal supporting sheets impregnated with plastic material and external laminates composed of bands of copper that wind continuously between one package and a next forming 180° bends in one direction and another direction with interposition of at least one sheet of steel; applying heat generated by connected ends of the copper bands to a generator of electrical current, said forming including making the packages from a multi-composition band composed both of the bands of supporting material impregnated with plastic material and of the copper bands so as to produce a plastic laminate for a printed circuit.

2. A process as defined in claim 1, wherein said making includes laying one end of the multi-composition band on a plate, laying thereafter a steel sheet on said end, and then bending the band at 180° after a second steel sheet has been laid, bending the band again at 180° in an opposite direction to the first bending, continuing the laying and bending until a desired number of packages has been reached, applying heat and pressure so as to form the printed circuit; and separating the printed circuit by cutting the multi-composition band that connects two adjacent printed circuits.

3. A process as defined in claim 1, wherein said forming includes winding the bands of supporting material impregnated with plastic material and the copper bands off reels for various bands respectively.

* * * * *